(12) United States Patent
Dziomkina

(10) Patent No.: US 8,512,817 B2
(45) Date of Patent: Aug. 20, 2013

(54) LITHOGRAPHIC APPARATUS AND A METHOD OF FORMING A LYOPHOBIC COATING ON A SURFACE

(75) Inventor: Nina Vladimirovna Dziomkina, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 191 days.

(21) Appl. No.: 12/956,843

(22) Filed: Nov. 30, 2010

(65) Prior Publication Data

US 2011/0135839 A1 Jun. 9, 2011

Related U.S. Application Data

(60) Provisional application No. 61/266,314, filed on Dec. 3, 2009, provisional application No. 61/314,753, filed on Mar. 17, 2010.

(51) Int. Cl.
*B05D 3/00* (2006.01)

(52) U.S. Cl.
USPC .............................. 427/553; 427/140; 438/4

(58) Field of Classification Search
USPC ................................. 427/553, 140
See application file for complete search history.

(56) References Cited

U.S. PATENT DOCUMENTS

| | | | |
|---|---|---|---|
| 4,509,852 A | 4/1985 | Tabarelli | |
| 5,418,919 A * | 5/1995 | Kadosawa et al. | 712/203 |
| 5,980,992 A | 11/1999 | Kistner | |
| 2004/0105083 A1 * | 6/2004 | Kurt et al. | 355/67 |
| 2004/0136494 A1 | 7/2004 | Lof | |
| 2004/0207824 A1 | 10/2004 | Lof | |
| 2006/0038968 A1 | 2/2006 | Kemper | |
| 2006/0109447 A1 * | 5/2006 | Moest et al. | 355/75 |
| 2006/0119809 A1 | 6/2006 | Verhagen | |
| 2008/0199977 A1 * | 8/2008 | Weigel et al. | 438/4 |
| 2009/0025753 A1 | 1/2009 | De Jong | |
| 2009/0027636 A1 | 1/2009 | Leenders | |
| 2009/0174870 A1 | 7/2009 | De Jong | |
| 2009/0206304 A1 | 8/2009 | Dziomkina | |
| 2009/0279062 A1 | 11/2009 | Direcks | |
| 2009/0286402 A1 * | 11/2009 | Xia et al. | 438/703 |
| 2010/0097587 A1 | 4/2010 | De Jong | |

FOREIGN PATENT DOCUMENTS

| | | |
|---|---|---|
| EP | 1 420 300 | 5/2004 |
| JP | 62-148943 | 7/1987 |
| JP | 2009-194385 | 8/2009 |
| WO | WO 99/49504 | 9/1999 |
| WO | WO 2005/064405 | 7/2005 |
| WO | 2009/104748 | 8/2009 |

OTHER PUBLICATIONS

Japanese Office Action mailed Jun. 12, 2012 in corresponding Japanese Patent Application No. 2010-268063.
Japanese Office Action mailed May 7, 2013 in corresponding Japanese Patent Application No. 2010-268063.

* cited by examiner

*Primary Examiner* — Michael Cleveland
*Assistant Examiner* — Sarah R Anderson
(74) *Attorney, Agent, or Firm* — Pillsbury Winthrop Shaw Pittman LLP

(57) ABSTRACT

A method of forming a lyophobic coating on a surface having oxidized groups is disclosed. The method includes bringing into contact with the surface a silane or siloxane having the formula $SiX_4$ wherein each X is the same or different, wherein at least one X is a leaving group and at least one X is a lyophobic group.

20 Claims, 7 Drawing Sheets

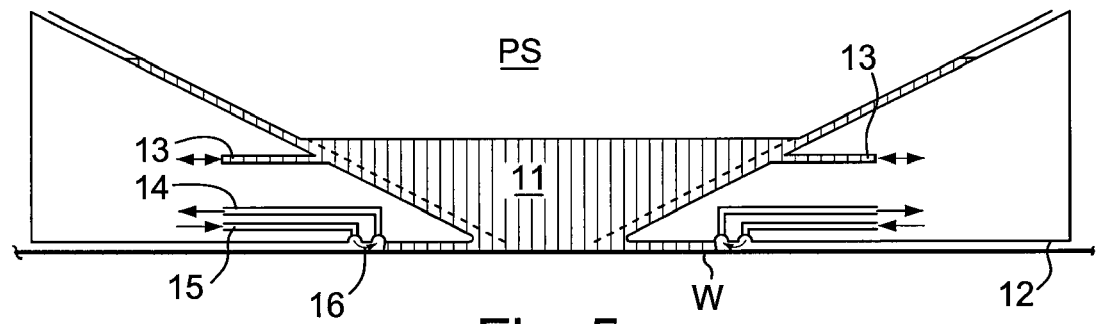
Fig. 5
Fig. 6
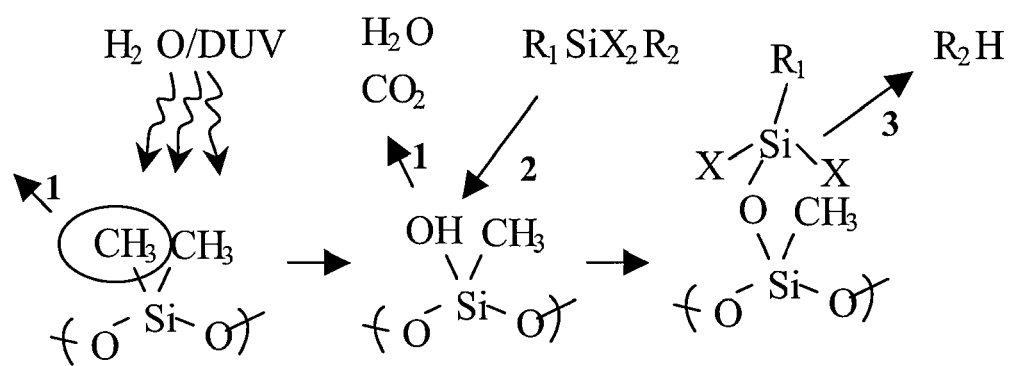

LITHOGRAPHIC APPARATUS AND A METHOD OF FORMING A LYOPHOBIC COATING ON A SURFACE

This application claims priority and benefit under 35 U.S.C. §119(e) to U.S. Provisional Patent Application Ser. No. 61/266,314, entitled "A Lithographic Apparatus and a Method of Forming a Lyophobic Coating on a Surface", filed on Dec. 3, 2009, and to U.S. Provisional Patent Application Ser. No. 61/314,753, entitled "A Lithographic Apparatus and a Method of Forming a Lyophobic Coating on a Surface", filed on Mar. 17, 2010. The contents of those applications are incorporated herein in their entirety by reference.

FIELD

The present invention relates to a lithographic apparatus, a method of forming a lyophobic coating on a surface, and a coating station.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, device structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

SUMMARY

In immersion lithography, the position of liquid needs to be controlled. The use of a lyophobic coating (e.g. hydrophobic with respect to water) on one or more certain surfaces can help in controlling the position of liquid, for example a meniscus of a liquid.

It is desirable, for example, to provide a method of forming a lyophobic coating on a surface. Desirably a method is provided which can be used to reinstate to a higher level the receding contact angle which immersion liquid makes with a surface, which may deteriorate over time, through use. It is desirable to provide a method and apparatus which can be used in-situ in a lithographic projection apparatus to form a lyophobic coating on a surface.

According to an aspect, there is provided a method of forming a lyophobic coating on a surface having oxidized groups, the method comprising bringing into contact with the surface a silane or siloxane having the formula $SiR1R2X_2$ wherein the R1, R2 and X are the same or different, wherein the R1 is a lyophobic group and the R2 is a leaving group or a group with a leaving group.

According to an aspect, there is provided a lithographic projection apparatus comprising a coating station configured to form a lyophobic coating on a surface of a component of the lithographic projection apparatus.

According to an aspect, there is provided a coating station to form a lyophobic coating on a surface of a component for a lithographic projection apparatus.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 5 depicts a further liquid supply system for use in a lithographic projection apparatus;

FIG. 6 depicts an example reaction path of the method of an embodiment of the present invention;

DETAILED DESCRIPTION

Figure 1:
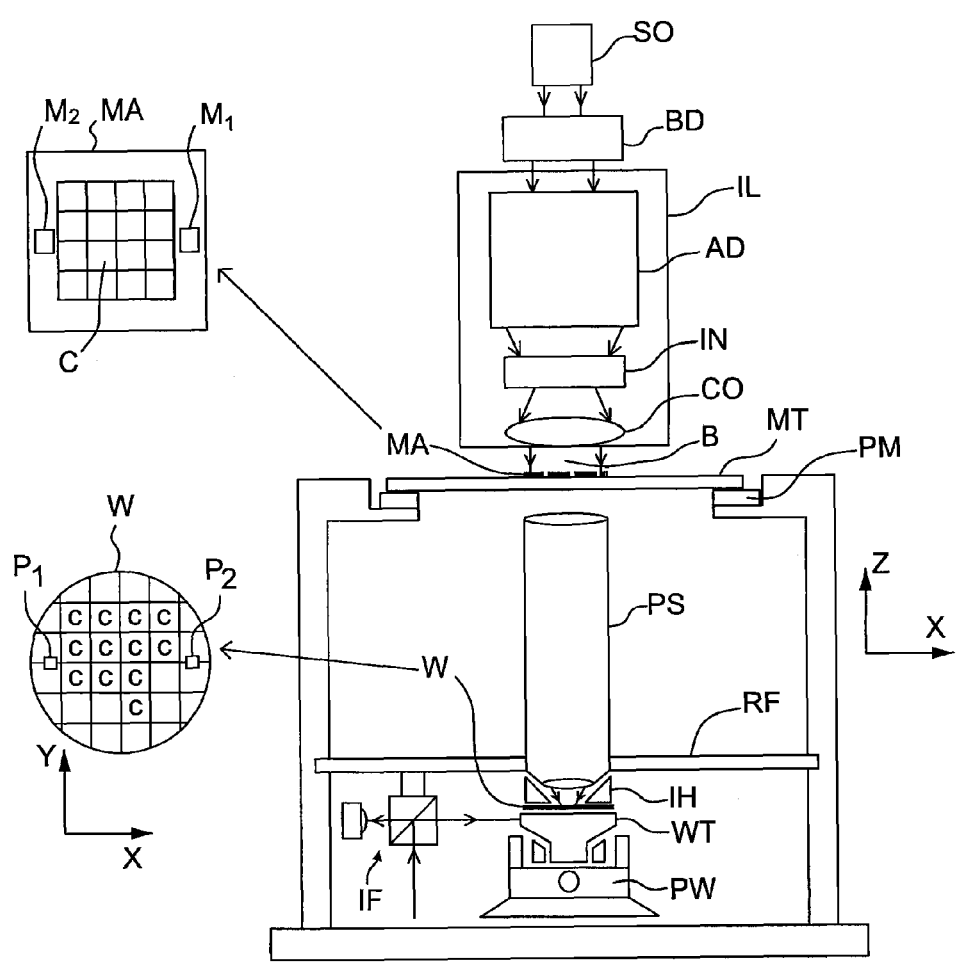
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a substrate table (e.g. a wafer table) WT constructed to hold a substrate (e.g. a resist-coated wafer) W and connected to a second positioner PW configured to accurately position the substrate W in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more tables at least one or all of which may hold a substrate (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system and the substrate can be classed into at least two general categories. These are the bath type arrangement and the so called localized immersion system. In the bath type arrangement substantially the whole of the substrate and optionally part of the substrate table is submersed in a bath of liquid. The so called localized immersion system uses a liquid supply system in which liquid is only provided to a localized area of the substrate. In the latter category, the space filled by liquid is smaller in plan than the top surface of the substrate and the area filled with liquid remains substantially stationary relative to the projection system while the substrate moves underneath that area. A further arrangement, to which an embodiment of the invention is directed, is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin film, of liquid on the substrate. Any of the liquid supply devices of FIGS. 2-5 may be used in such a system; however, sealing features are not present, are not activated, are not as efficient as normal or are otherwise ineffective to seal liquid to only the localized area. Four different types of localized liquid supply systems are illustrated in FIGS. 2-5.

Figure 2:
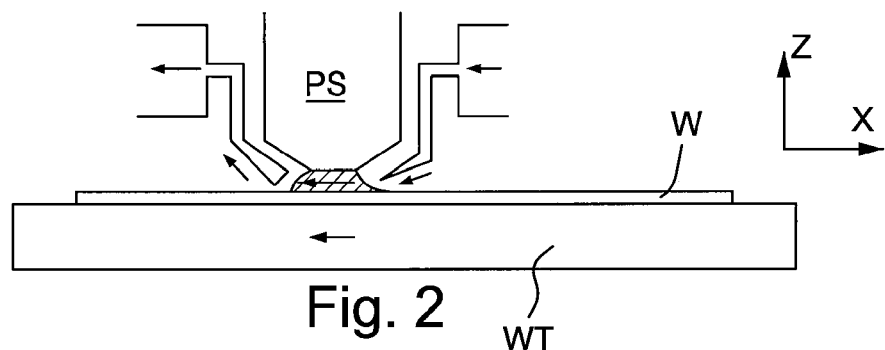
FIGS. 2 and 3 depict a liquid supply system for use in a lithographic projection apparatus.
Figure 3:
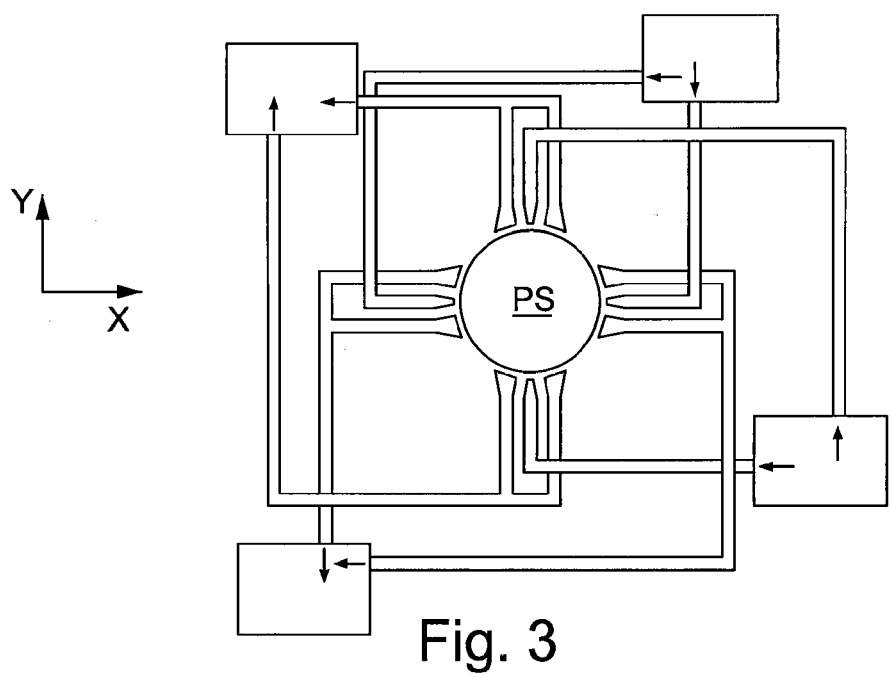

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet onto the substrate, desirably along the direction of movement of the substrate relative to the final element, and is removed by at least one outlet after having passed under the projection system. That is, as the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. The arrows above the substrate W illustrate the direction of liquid flow, and the arrow below the substrate W illustrates the direction of movement of the substrate table. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Arrows in liquid supply and liquid recovery devices indicate the direction of liquid flow.

Figure 4:
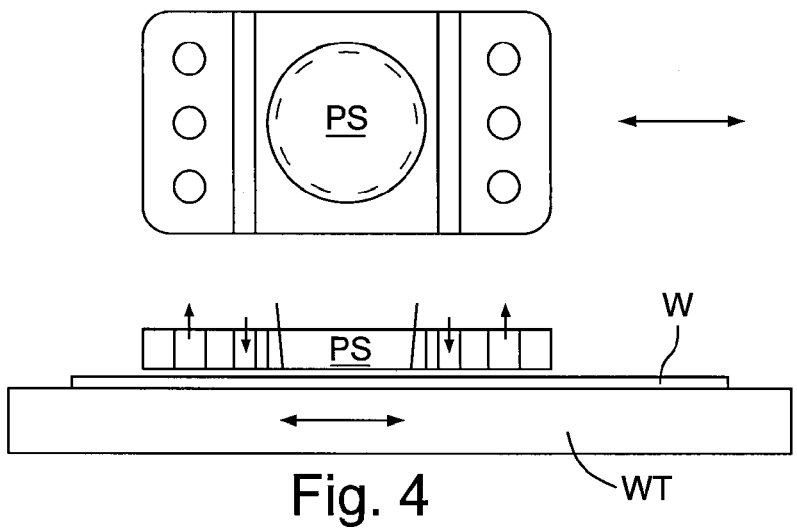
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets and outlets can be arranged in a plate with a hole in its center and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). In the cross-sectional view of FIG. 4, arrows illustrate the direction of liquid flow in inlets and out of outlets.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. In an arrangement, the apparatus has only one table, or has two tables of which only one can support a substrate.

PCT patent application publication no. WO 2005/064405 discloses an all wet arrangement in which the immersion liquid is unconfined. In such a system the whole top surface of the substrate is covered in liquid. This may be advantageous because then the whole top surface of the substrate is exposed to the substantially same conditions. This has an advantage for temperature control and processing of the substrate. In WO 2005/064405, a liquid supply system provides liquid to the gap between the final element of the projection system and the substrate. That liquid is allowed to leak (or flow) over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate in all positions and which is arranged to have immersion liquid extending between it and the top surface of the substrate and/or substrate table which holds the substrate.

Another arrangement which has been proposed is to provide the liquid supply system with a fluid handling structure. The fluid handling structure may extend along at least a part of a boundary of the space between the final element of the projection system and the substrate table. Such an arrangement is illustrated in FIG. 5. The fluid handling structure is substantially stationary relative to the projection system in the XY plane though there may be some relative movement in the Z direction (in the direction of the optical axis). A seal is formed between the fluid handling structure and the surface of the substrate. In an embodiment, a seal is formed between the fluid handling structure and the surface of the substrate and may be a contactless seal such as a gas seal. Such a system is disclosed in United States patent application publication no. US 2004-0207824. In another embodiment the fluid handling structure has a seal which is a non-gaseous seal, and so may be referred to as a liquid confinement structure.

FIG. 5 schematically depicts a localized liquid supply system or fluid handling structure or device with a body 12 forming a barrier member or liquid confinement structure, which extends along at least a part of a boundary of the space 11 between the final element of the projection system PS and the substrate table WT or substrate W. (Please note that reference in the following text to surface of the substrate W also refers in addition or in the alternative to a surface of the substrate table WT, unless expressly stated otherwise.) The liquid handling structure is substantially stationary relative to the projection system PS in the XY plane though there may be some relative movement in the Z direction (generally in the direction of the optical axis). In an embodiment, a seal is formed between the body 12 and the surface of the substrate W and may be a contactless seal such as a gas seal or fluid seal.

The fluid handling structure at least partly contains liquid in the space 11 between a final element of the projection system PS and the substrate W. A contactless seal, such as a gas seal 16, to the substrate W may be formed around the image field of the projection system PS so that liquid is confined within the space 11 between the substrate W surface and the final element of the projection system PS. The space 11 is at least partly formed by the body 12 positioned below and surrounding the final element of the projection system PS. Liquid is brought into the space 11 below the projection system PS and within the body 12 by liquid inlet 13. The liquid may be removed by liquid outlet 13. The body 12 may extend a little above the final element of the projection system PS. The liquid level rises above the final element so that a buffer of liquid is provided. In an embodiment, the body 12 has an inner periphery that at the upper end closely conforms to the shape of the projection system PS or the final element thereof and may, e.g., be round. At the bottom, the inner periphery closely conforms to the shape of the image field, e.g., rectangular, though this need not be the case. The inner periphery may be any shape, for example the inner periphery may conform to the shape of the final element of the projection system. The inner periphery may be round.

The liquid is contained in the space 11 by the gas seal 16 which, during use, is formed between the bottom of the body 12 and the surface of the substrate W. The gas seal 16 is formed by gas, e.g. air or synthetic air but, in an embodiment, $N_2$ or another inert gas. The gas in the gas seal 16 is provided under pressure via inlet 15 to the gap between body 12 and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the body 12 and the substrate W contains the liquid in a space 11. The inlets/outlets may be annular grooves which surround the space 11. The annular grooves may be continuous or discontinuous. The flow of gas is effective to contain the liquid in the space 11. Such a system is disclosed in United States patent application publication no. US 2004-0207824.

The example of FIG. 5 is a so called localized area arrangement in which liquid is only provided to a localized area of the top surface of the substrate W at any one time. Other arrangements are possible, including fluid handling structures which make use of a single phase extractor or a two phase extractor as disclosed, for example, in United States patent application publication no US 2006-0038968. In an embodiment, a single or two phase extractor may comprise an inlet which is covered in a porous material. In an embodiment of a single phase extractor the porous material is used to separate liquid from gas to enable single-liquid phase liquid extraction. A chamber downstream of the porous material is maintained at a slight under pressure and is filled with liquid. The under pressure in the chamber is such that the meniscuses formed in the holes of the porous material prevent ambient gas from being drawn into the chamber. However, when the porous surface comes into contact with liquid there is no meniscus to restrict flow and the liquid can flow freely into the chamber. The porous material has a large number of small holes, e.g. of diameter in the range of 5 to 300 μm, desirably 5 to 50 μm. In an embodiment, the porous material is at least slightly lyophilic (e.g., hydrophilic), i.e. having a contact angle of less than 90° to the immersion liquid, e.g. water.

Many other types of liquid supply system are possible, for example a gas drag arrangement where a liquid meniscus is pinned at outlet openings by two phase extraction such as is disclosed in United States patent application publication no. US 2009-0279062, hereby incorporated in its entirety by reference. The present invention is not limited to any particular type of liquid supply system. The present invention may be advantageous for use with a confined immersion system in which the liquid between the final element of the projection system and the substrate is confined, for example, in optimizing the use. However, the invention can be used with any other type of liquid supply system.

Many components of an immersion lithographic apparatus have a surface which has a particular contact angle range with respect to the immersion liquid. The surface thus has a surface property with respect to the liquid. Such a surface may be lyophobic or lyophilic, or hydrophobic or hydrophilic with respect to water. Such a surface may be used to help control the position of liquid, for example to prevent liquid loss. If the position of liquid is not correctly controlled, this can lead to unwanted measurement errors or increased defectivity. In an embodiment, a coating may be used to provide the surface property. The surface property, for example a lyophobic coating, may suffer from degradation in the contact angle which immersion liquid makes with the coating during use. This may be particularly noticeable for those surfaces, e.g. coatings, which are subjected to radiation from the projection beam and/or are exposed to liquid.

Examples of components or parts of components which might be covered with a lyophobic coating include part of the top surface of the substrate table, a side surface of the substrate table forming a channel at the gap between the substrate and the substrate table, an adherable planar sheet (e.g. a sticker) which may provide a surface property to a surface and/or bridge a gap adjacent an object, a sensor (e.g. a transmission image sensor (TIS), dose sensor, spot sensor, lens interferometer (e.g. interferometric wavefront measurement sensor)), the final element of the projection system for example the surface out of the optical path, a part of any fluid handling structure, for example its top surface facing the projection system and at least part of its undersurface, and/or a closing surface such as a dummy substrate, second table or bridging element between two tables.

A closing surface is a surface used to block an opening of a fluid handling structure during, for example, table swap under the projection system PS replacing, for example, a substrate. The closing surface may be or include a dummy substrate, a bridging element, or a separate table. The tables are exchanged using the dummy substrate to confine the fluid in the space 11 during the exchange. A closing surface as a bridging element (which may be referred to as a swap bridge) may be retractable and may be a part of one of the tables. The bridging element may function as a dummy substrate present in the gap between at least two tables (for example a substrate table and a measurement table or two substrate tables) during, for example, swapping of tables (e.g. two substrate tables or a substrate table for a measurement table) under the projection system PS. The bridging element may be attached to a table, for example at least the duration during which the bridging element passes underneath the projection system PS. In an embodiment the closing surface may be part of a separate table, such as a measurement table MST.

If the contact angle which immersion liquid makes with the coating providing a surface component to a component (as mentioned herein) is outside a range limit, for example exceeds above or recedes below a certain threshold, action should be taken to reinstate the contact angle; otherwise machine performance may deteriorate. (Note that reference hereinafter to a contact angle, such as a lyophobic surface, becoming more lyophilic below a certain threshold is considered to include reference to a contact angle, for example a lyophilic surface, becoming more lyophobic, above a certain threshold, unless the contrary is stated. Reference to a deteriorated coating includes reference to deterioration of a surface property of an uncoated surface unless otherwise stated.) One way of doing this is to replace the component. This is undesirable because of the cost involved in replacing the component and the downtime of the apparatus which results from the need to replace the component. Alternatively or additionally, an adherable planar component, for example a sticker, may be placed over the surface. The sticker has the desired contact angle property with the immersion liquid. This method may be undesirable because it may require the removal of the component from the apparatus for proper application of the sticker, thereby requiring downtime of the apparatus. A sticker has a certain minimum thickness so that applying a sticker can result in a change in the level of the surface. Applying a sticker may undesirably result in a change in the surface topography. Additionally, the application of a sticker may change a mechanical property of the surface to which it is applied and/or an optical property of the surface to which it is applied.

A method of chemical application of a coating is disclosed herein. The method can be used to treat a surface for the first time. The method can be used to reinstate a degraded lyophobic coating. In particular, the method can be used to reinstate an organosilicon coating which has degraded. An example organosilicon coating is $SiO_xC_yH_z$, for example Lipocer™.

$SiO_xC_yH_z$, as, for example, described in United States patent application publication no. US 2009-0206304, degrades in the presence of water and UV radiation through use (for example, generally after a certain number of doses of exposure radiation). A methyl group of the coating is oxidized in steps, for example to a hydroxyl group or an oxygen atom with a free electron pair with water and $CO_2$ being given off as waste products.

$SiO_xC_yH_z$ can be applied by wet chemical deposition or CVD in the process described in United States patent application publication no. US 2009-0206304.

In an embodiment, the coating may be a monolayer coating, contrary to the coating of United States patent application publication no. US 2009-0206304.

In an embodiment, the coating may be only one monolayer thick or only a fraction of or a few nanometers thick (for example selected from the range of 0.1-100 nm, the range of 0.1-50 nm or the range of 0.1-20 nm). In an embodiment, the coating is a self-assembled monolayer.

The chemical application thereby does not significantly affect the underlying surface topography of the component and does not significantly change the height of the component (which in itself can be important for controlling liquid loss) or an optical property of the component.

A precursor of the lyophobic coating is brought into contact with the surface. The precursor reacts with the surface thereby forming the lyophobic coating. In particular, the surface is a surface having an oxidized group, particularly an oxygen atom with a free electron pair or a hydroxyl group. The precursor is a silane or siloxane. The precursor may be a mixture of two or more different silanes and/or siloxanes. The precursor may have the formula $SiX_4$ wherein each X is the same or different. At least one X is a leaving group. During reaction with the surface the leaving group leaves the silane or siloxane and the Si of the silane or siloxane bonds to the surface. At least one X is a lyophobic group. Therefore when the silane or siloxane is reacted with and attached to the surface the lyophobic group is present extending from this surface so that the surface becomes lyophobic.

The precursor reacts with the surface. In particular the Si group of the precursor bonds to the surface (for example through an oxygen atom) and a waste product is generated. The waste product may be the leaving group combined with a hydrogen atom.

An example reaction path is illustrated in FIG. 6. At step 1, a hydrophobic polysiloxane coating which comprises lyophobic methyl groups is illustrated. On exposure to water and DUV radiation, as is present in an immersion lithographic apparatus, water tends to absorb on the Si atom and form hydroxyl chemical bonding. This leads to an overall decrease in the contact angle which liquid would make with the coating. That is, the coating degrades as illustrated in step 2.

A precursor of the form $SiR1R2X_2$ is brought into contact with the surface. This may be either in the gaseous or liquid phase, as described below. The group R1 is a lyophobic group and the group R2 is a leaving group or a group with one or more leaving groups.

On reaction at step 3, the leaving group R2 leaves and the Si atom bonds to the oxygen atom of the hydroxyl group. The hydrogen atom of the hydroxyl group also leaves. The leaving group $R_2$ and the hydrogen atom from the hydroxyl group may combine to form a waste product. This reaction leaves on the surface the lyophobic group $R_1$ so that the lyophobic nature of the surface is restored.

As can be seen, this reaction mechanism occurs when oxidized groups are present on the surface. Typically a degraded surface or a surface which can successfully be coated using the method described herein has oxidized groups present on the surface at a fraction of at least 0.1 of the groups on the surface, at least 0.2 of the groups on the surface, at least 0.3 of the groups on the surface, at least 0.4 of the groups on the surface or at least 0.5 of the groups on the surface. In one embodiment oxidized groups are present at a fraction of at least 0.75 of the groups on the surface.

A $SiO_xC_yH_z$ coating as described in United States patent application publication no. US 2009-0206304 is applied using a plasma process (CVD). The plasma is generated from HMDSO to apply a coating by recombination of radicals from the plasma. An embodiment of the present invention concerns molecules with chemically reactive groups. Here, the molecules are transported in a gas phase as whole molecules to the surface on which the coating is to be formed by. On reaching the surface, the molecules form a coating by chemical reaction: there is no breakage of the bonds making the molecules other than by chemical reaction paths.

A lyophobic group R1 may be a group selected from the group consisting of hydrocarbyls $(CH_2)_nCH_3$ where n is between 0 and 11 (desirably 0); perfluorodecyl $(CH_2)_2(CF_2)_n$ F, where n is between 1 and 8, $CF_3$, and F; siloxane $(Si(CH_3)_2 O)_n$, terminated by the leaving group R2, where n is between 1 and 4 (desirably 1).

Suitable leaving groups or groups with at least one leaving group R2 are anions selected from the group consisting of H, Cl, F, Br, I, OH or hydrocarbyls $(CH_2)_nCH_3$ where n is between 0 and 11 (desirably 0). Desirably the leaving groups are halogen and hydroxyl anions, as an alkylgroup can only be a leaving group under specific conditions, such as exposure to DUV radiation or a specific temperature.

The other groups X of the precursor are, in an embodiment, either leaving or lyophobic group, or both, desirably a methyl group, $CH_3$ or one of the halogens.

In an embodiment, the group with a leaving group R2 is a siloxane $(Si(CH_3)_2O)Cl$ (i.e. with a Cl leaving group), the leaving group is a Cl and the remaining two X are a methyl group ($CH_3$) so that the precursor is 1,3-dichlorotetramethyldisiloxane.

In an embodiment, the leaving group and the lyophobic group are different. This increases the yield of the reaction.

Before bringing silane or siloxane into contact with the surface, it is desirable to prepare the surface. Preparing the surface may comprise cleaning of the surface to remove foreign matter and/or any loose prior coating. Preparing the surface may also include deliberately forming hydroxyl groups onto the surface.

Cleaning of the surface may comprise, for example, plasma cleaning as described in United States patent application publication no. US 2009-0174870 and/or cleaning with ozone as described in United States patent application publication no. US 2009-0025753 and/or cleaning with UV radiation as described in United States patent application publication no. US 2009-0027636 and/or cleaning with a cleaning liquid which may comprise one or more types of chemicals from the group comprising: soap, solvent, surfactant as described in U.S. patent application publication no. US 2010-0097587, and/or an oxidizing liquid such as a strong acid or base or a mixture of peroxide and sulfuric acid. UV radiation and the presence of ozone and water (in liquid or vapor form) may additionally or alternatively be used in order to promote the presence of oxidized/hydroxyl groups. Exposing the surface to water vapor and/or water in liquid phase may help promote the generation of oxidized/hydroxyl groups.

The silane or siloxane may be brought into contact with the surface in a liquid state. For example, the silane or siloxane may be dissolved in a solvent such as dry toluene, for example dry toluene with a concentration of 2% by volume. The solution is kept under nitrogen atmosphere and the cleaned surface to be coated is then submersed in the solution. The surface may be submersed for a suitable amount of time, for example at least 20, 30 or 40 minutes. After submersion the surface is rinsed, for example, in toluene. The surface may then be dried, for example in nitrogen. It may be necessary to dry the surface at elevated temperature, for example at 50° C. for a period of time. Drying at elevated temperature for a time of about 30 minutes may be suitable. The surface may be rinsed with ultra pure water. Thereafter the surface may be rinsed and dried again, for example with nitrogen. The surface may be placed in a convection oven for 30 minutes at 50° C.

In an embodiment, the silane or siloxane is brought into contact with the surface in gaseous form.

Figure 7:
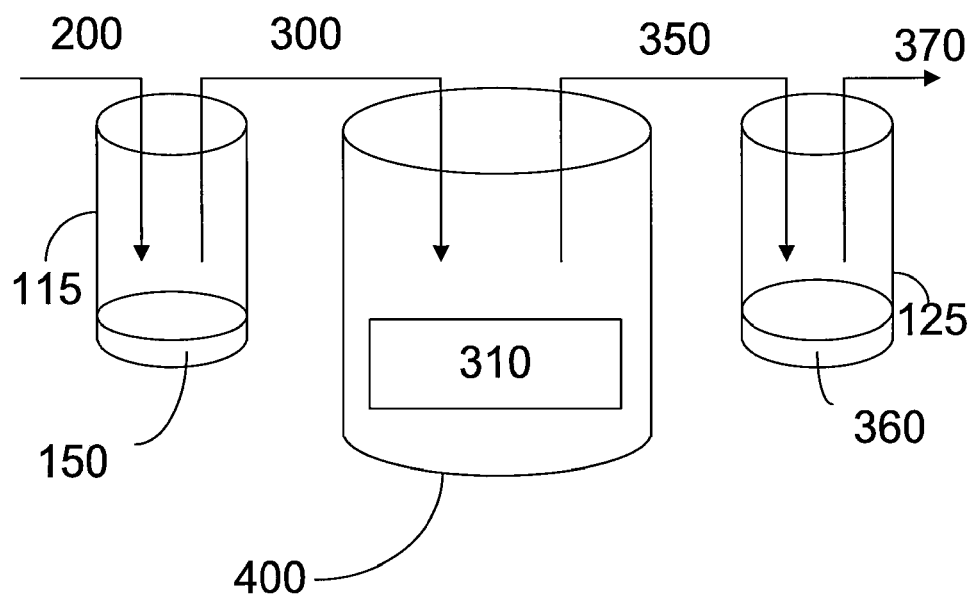
FIG. 7 depicts schematically a gas phase application method of an embodiment of the present invention.

FIG. 7 illustrates schematically an example as to how the silane or siloxane can be brought into contact with the surface in the gaseous phase. The silane or siloxane precursor 150 is placed in a first compartment, a preparation compartment 115. In the preparation compartment the precursor is mixed with a carrier gas, for example nitrogen gas introduced at 200, and the mixture is transported at 300 into a second compartment which may be a reaction vessel 400. The surface to be coated 310 is placed in the reaction vessel, desirably horizontally to ensure uniform deposition. The precursor comes into contact with the surface where it reacts.

Nitrogen carrier gas, unreacted silane or siloxane and biproducts (typically a leaving group combined with the H atom from the hydroxyl group on the surface) are extracted at 350 from the reaction vessel and taken to a third compartment 125. A precursor trap 360 in the third compartment, which is kept under nitrogen atmosphere, traps unreacted precursor for reuse or disposal. The carrier gas then leaves the third compartment at 370.

Typically the coated substrate spends 2-60 minutes in the second compartment being exposed to silane or siloxane precursor. The duration should be at least 10 minutes in order to ensure a full coverage of the required surface with a monolayer coating (i.e. a complete reaction of the reactive substrate groups with a precursor).

After gas phase deposition, the surface may be rinsed, in a solvent, for example in toluene to remove excess silane and/or siloxane precursor. The surface may then be dried with nitrogen. Subsequently the surface may be rinsed in ultra pure water and dried, as with the wet chemical application.

Figure 8:
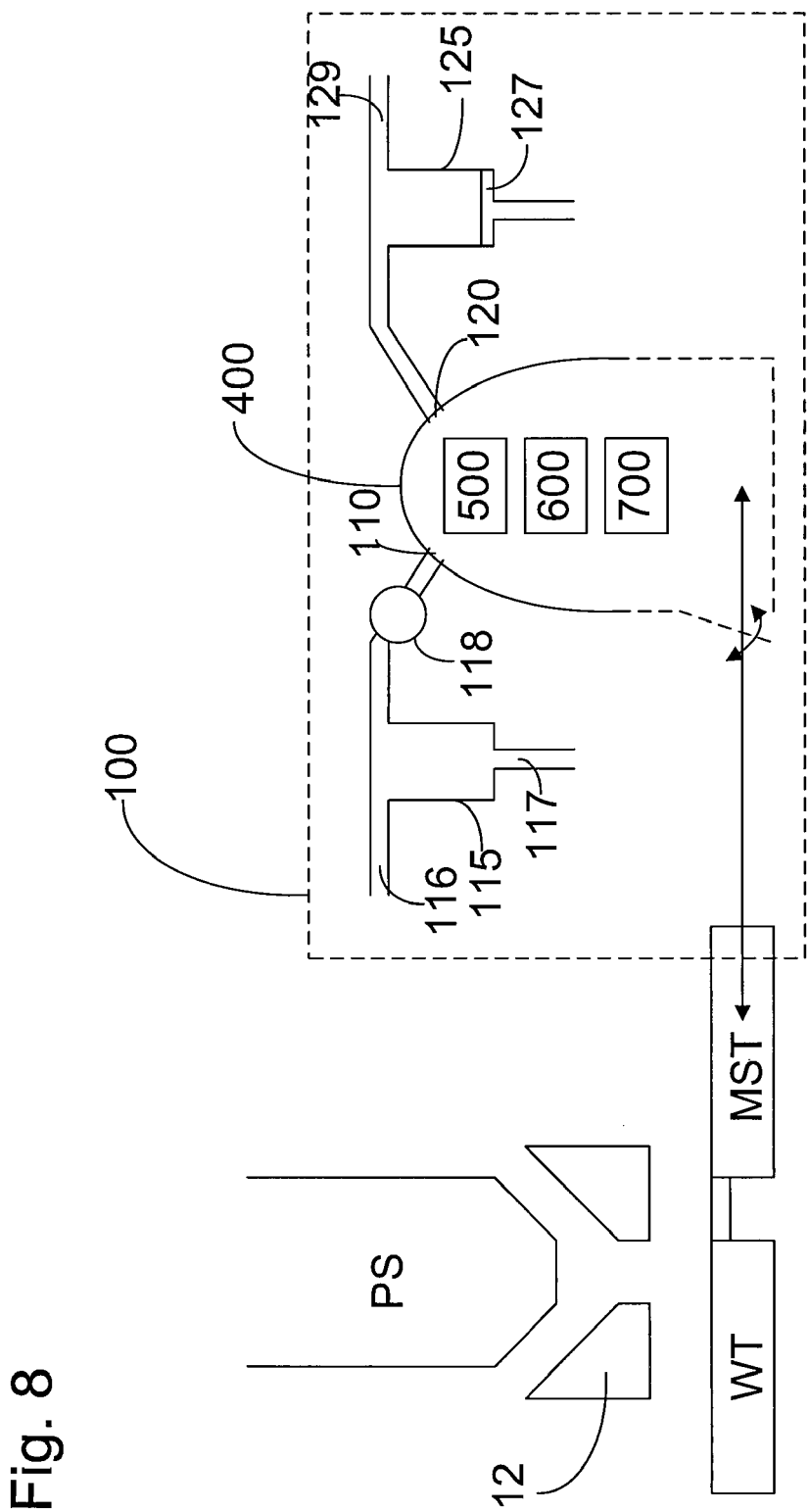
FIG. 8 illustrates schematically a lithographic projection apparatus of an embodiment of the present invention.

In the case where the method is being used to reinstate components of a lithographic projection apparatus, desirably the method is carried out in-situ in the lithographic projection apparatus. For this purpose a coating station 100 may be provided to form a lyophobic coating on a surface of a component of the lithographic projection apparatus. An example is illustrated in FIG. 8. In an embodiment the lithographic projection apparatus is provided with a coating station 100. In another embodiment the coating station 100 is a separate component. As a separate component, the coating station is attached to the apparatus with which it is to be used, for example a lithographic apparatus, when required for use. The coating station may be used on detection of a surface with a deteriorated surface property which may be repaired by operation of the coating station 100. In an embodiment, the coating station 100 is sited such that one ore more substrate tables WT and/or one or more measurement tables MST can enter the coating station 100 without leaving the apparatus, e.g. the lithographic projection apparatus. This arrangement allows coating of a surface in-situ and results in short downtime of the apparatus.

The coating station may comprise a reaction vessel 400. The reaction vessel 400 is for containing the silane or siloxane precursor and for bringing the precursor into contact with the surface. For this purpose the surface must be exposed to the inside of the reaction vessel 400.

The reaction vessel 400 may take any form. In one embodiment the reaction vessel 400 is in the form of any sort of cover, such as a walled cover, e.g. a dome, which is placed over the surface. The reaction vessel 400 has an opening through which the surface can be exposed to the precursor in the reaction vessel 400. The opening through which the surface can be exposed is defined by the end wall(s) of the dome. The dome is sealed to the surface or to the surface surrounding the surface to be coated. The sealing of the dome to the surface may be achieved by sealing the end wall(s) of the dome to the surface to be coated or to a surface surrounding the surface to be coated. During use, the precursor may be contained in the reaction vessel. In an embodiment the reaction vessel has a closeable opening, such as a doorway with a door to allow a whole component to be placed in the reaction vessel. The door may be closed thereby to contain the precursor. So, the surface is insertable into and removable from the reaction vessel.

The reaction vessel 400 has a supply inlet 110 to supply precursor into the reaction vessel 400. The supply inlet 110 is connected to a first compartment 115 to which carrier gas, for example nitrogen, is supplied through a carrier inlet 116 and to which a precursor is supplied through precursor inlet 117. The carrier gas and precursor are mixed in the first compartment 115 before being provided through a conduit to the supply inlet 110 into the reaction vessel 400. A motor 118 may be provided to pump gas. The motor 118 may be provided in the conduit between the first compartment 115 and the reaction vessel 400, upstream of the carrier inlet 116 for carrier gas or upstream of the precursor inlet 117 for precursor. Alternatively or additionally, the motor 118 may be provided downstream of the reaction vessel as well. One or more motors may be provided each being positioned in any of the above mentioned locations.

The reaction vessel 100 is also provided with a removal outlet 120 to remove gases there through from the reaction vessel 400. Downstream of the removal outlet 120 is a further compartment 125 for the positioning therein of a precursor trap 127. The further compartment 125 has a removing outlet 129 to remove carrier gas and by-product from the further compartment 125.

The coating station 100 may comprise a surface preparation module 300. The surface preparation module 500 may be present separate from the reaction vessel 400 or, more conveniently, may be inside the reaction vessel 400 or both. Parts of the surface preparation module 500 may be inside the reaction vessel 400 and other parts may be outside the reaction vessel 400. The surface preparation module 500 may clean the surface prior to the surface being brought into contact with the silane or siloxane precursor as described herein. The surface preparation module 500 may additionally or alternatively encourage formation of hydroxyl groups on the surface as described above. In particular, the cleaning module may comprise a UV or DUV source to irradiate the surface with UV or DUV radiation as well as a fluid or plasma providing channel to provide cleaning liquid, immersion liquid such as water, gas (e.g. ozone) or plasma or water to the surface.

The coating station 100 may comprise a rinsing module 600 to rinse the surface after coating. The coating station may also comprise a drying module 700 to dry the surface (optionally at elevated temperature) after coating. The drying and rinsing modules 600, 700 may be completely or partly within or outside of the reaction vessel 400. The coating station 100 is adapted to perform the method as described above.

Experiments which have been carried out are now described which illustrate one or more advantages of an embodiment of the present invention.

Figure 9:
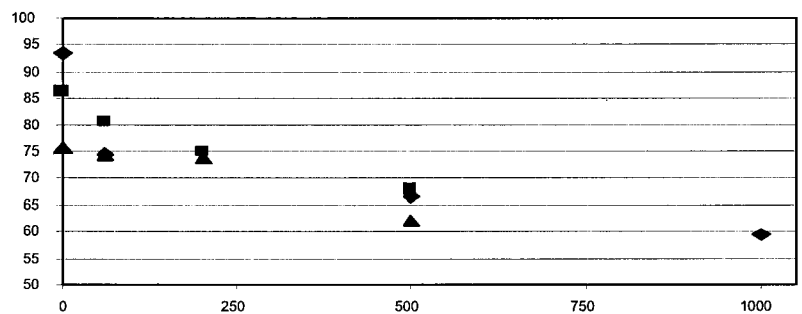
FIG. 9 is a graph of receding contact angle changing with number of pulses of exposure radiation for three different coatings.

FIG. 9 shows a comparison in the receding coating angle of water (on the y-axis in degrees) on three different surfaces changing with the number of pulses (on the x-axis in number of pulses, 1e+3) of DUV radiation with a water flow of 1 L/min. The DUV source had a wavelength of 193 nm and a dose of 0.25 mJ/cm$^2$/pulse. As can be seen, the lyophobic coating $SiO_xC_yH_z$ shown as diamonds degrades over time. The results shown by squares and triangles are for a $SiO_xC_yH_z$ coating which has degraded over time and has been reinstated using the gas phase deposition method described above with 10 minute exposure to dimethylsiloxane and dimethylsilane precursors respectively. As can be seen, the receding contact angle of water with the reinstated surfaces is substantially the same as that for the original coating. This shows that the coating lifetime is acceptable (as good as $SiO_xC_yH_z$) and that the method can be used for reinstating an original coating.

Figure 10:
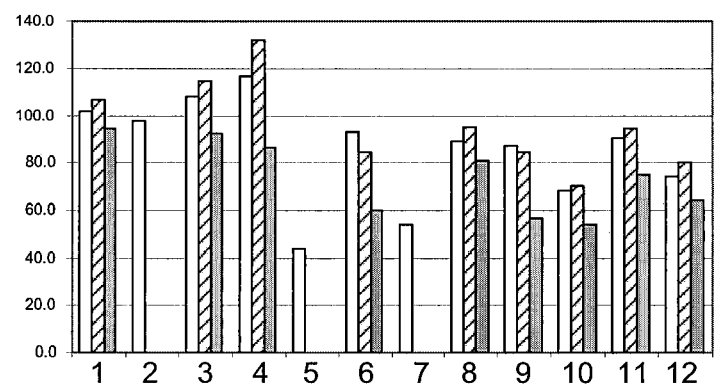
FIG. 10 illustrates advancing, receding and, static contact angle for a plurality of coatings made with different precursors.

FIG. 10 shows how the contact angle (y axis in degrees) of coatings made on glass substrates by a number of suitable precursors compare to the advancing, static and receding contact angle of a $SiO_xC_yH_z$ coating on a glass substrate. Different examples are shown on the x axis. For each sample up to three different types of contact angle measurement were made: static contact angle (no shading), advancing contact angle (cross-hatched) and receding contact angle (shaded). The examples are: 1: $SiO_xC_yH_z$ coating; 2: perfluorodecyl dimethyl chlorosilane; 3: perfluorodecyl methyl dichlorosilane; 4: perfluorodecyl trichlorosilane; 5: dodecyl dimethyl chlorosilane; 6: dodecyl methyl dichlorosilane; 7: trimethyl chlorosilane; 8: dichloro dimethylsilane; 9: trichloro methylsilane; 10: polydimethylsiloxane (silanol terminated); 11: 1,3-dichlorotetramethyldisiloxane; 12: 1,5-dichlorohexamethyltrisiloxane. These examples were prepared using a wet chemical application technique as described above with 30 minute submersion and show that dichlorodimethylsilane, perfluorodecyl methyl dichlorosilane and 1,3-dichlorotetramethyldisiloxane are particularly suited to this purpose as their advancing and receding contact angles lie within the specified advancing and receding contact angles which are illustrated as being 110° and 70° in a lithographic projection apparatus for lyophobic coatings. Other precursors which may be suitable are perfluorodecyldimethyl chlorosilane, perfluorodecylmethyl dichlorosilane, perfluorodecyltrichlorosilane, dodecylmethyl dichlorosilane and 1,5-dichlorohexamethyltrisiloxane. Precursors which may not be as suitable are dodecyldimethyl chlorosilane, trimethylchlorosilane and polydimethylsiloxane which is silanol terminated. The most preferred precursors are those with at least two leaving groups as these are more strongly bonded to the surface.

The most desirable precursors are those with little steric hindrance (e.g. fewest methyl or larger groups hindering access of oxidized groups on the surface to the leaving groups (i.e. halogens)). OH groups as leaving groups are not desirable because they are less reactive than other leaving groups. Shorter chain lengths for precursors are more desirable than longer chains due to steric hindrance.

Figure 11:
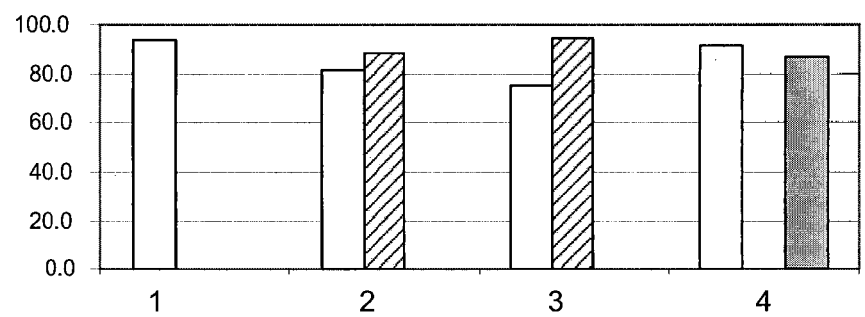
FIG. 11 illustrates receding contact angle varying with application technique for a number of different precursors.

FIG. 11 shows how the receding contact angle of water, e.g. ultra-pure water, (y-axis in degrees) on a treated glass surface can vary depending upon the application technique. FIG. 11 shows four different sample coatings: $SiO_xC_yH_z$ (number 1), dichlorodimethylsilane (number 2), 1,3-dichlorotetramethyldisiloxane (number 3), and perfluorodecyl methyl dichlorosilane (number 4). FIG. 11 shows that, for dichlorodimethylsilane (number 2) and 1,3-dichlorotetramethyldisiloxane (number 3), application in the gas phase (cross-hatching) is preferred because the receding contact angle achievable is greater and more reproducible. The tests carried out for those two chemicals were with a gas phase deposition of 10 minutes (cross-hatching) compared to a wet chemical application of 30 minutes (no shading). For perfluorodecyl methyl dichlorosilane (number 4), wet chemical deposition (no shading) may be preferable. This is because the receding contact angle achieved is greater for wet chemical deposition than for gas phase deposition of 60 minutes (shaded). For comparison a $SiO_xC_yH_z$ coating (number 1) is also plotted using a wet chemical application of 30 minutes (no shading).

Figure 12:
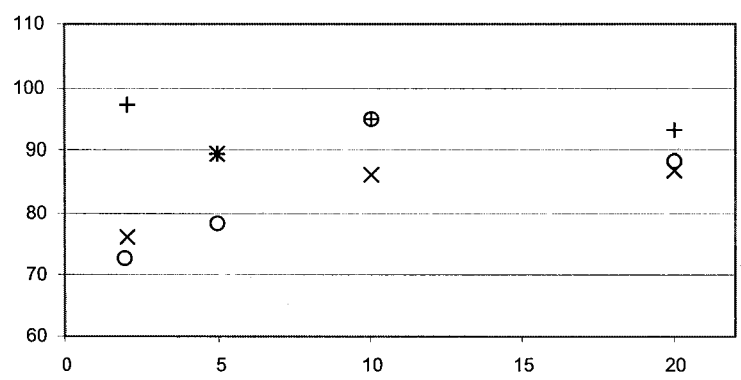
FIG. 12 illustrates receding contact angle changing with depositing time by a gas phase application method on different types of surfaces for 1,3-dichlorotetramethyldisiloxane.

FIG. 12 shows how the receding contact angle (y-axis in degrees) varies for a surface (glass (shown as a + in FIG. 12), glass-ceramic (shown as a o in FIG. 12), and $SiO_xC_yH_z$ (shown as a x in FIG. 12)) which is treated with a gas phase of 1,3-dichlorotetramethyldisiloxane for varying amounts of time (x-axis in minutes). As can be seen, after 10 minutes for glass, glass-ceramic, and $SiO_xC_yH_z$, a steady receding contact angle is achieved. The surface property over the treated surface may have substantially consistent or uniform contact angle. Therefore for forming a lyophobic coating on a surface using 1,3-dichlorotetramethyldisiloxane as a precursor a deposition time of at least 10 minutes is desirable. The time to achieve homogeneous coverage of the monolayer coating depends on the properties of the surface. Coating glass is fastest because the number of reactive sites (hydroxyl groups) is lowest (the glass is more oxidized than the other surfaces).

Tests have shown that cleaning is best achieved by physical wiping with a cloth impregnated with isopropanol (IPA) and then by exposure to ultraviolet radiation and ozone for about 10 minutes. However, exposure to ultraviolet radiation and/or ozone for anywhere between 2-60 minutes may achieve good results.

As will be appreciated, any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

In an embodiment, there is provided a method of forming a lyophobic coating on a surface having oxidized groups, the method comprising bringing into contact with the surface a silane or siloxane having the formula $SiR1R2X_2$ wherein the R1, R2 and X are the same or different, wherein the R1 is a lyophobic group and the R2 is a leaving group or a group with a leaving group. In an embodiment, the surface comprises a polysiloxane structure wherein a proportion of the Si atoms at the surface have the oxidized groups. In an embodiment, the oxidized groups are a hydroxyl group, or an oxygen atom with a free electron pair, or both. In an embodiment, all or some of the Xs are either a leaving group or a lyophobic group. In an embodiment, one or both X is a methyl group or a halogen. In an embodiment, the lyophobic group R1 is selected from the group consisting of: $(CH_2)_nCH_3$; $(CH_2)_2(CF_2)_nF$; $CF_3$; $F$; $(Si(CH_3)_2O)_n$ terminated by the leaving group R2. In an embodiment, the leaving group or group with a leaving group R2 is selected from the group consisting of: H, Cl, F, Br, I, OH and $(CH_2)_nCH_3$. In an embodiment, the silane or siloxane is one or more compounds selected from the group consisting of: dichlorodimethylsilane, trichloromethylsilane, 1,3-dichlorotetramethyldisiloxane, 1,5-dichlorohexamethyltrisiloxane, dodecylmethyl dichlorosilane, perfluorodecyltrichlorosilane, perfluorodecyldimethyl chlorosilane or perfluorodecyl methyl dichlorosilane. In an embodiment, the method further comprises, prior to bringing the silane or siloxane in contact with the surface, preparing the surface. In an embodiment, preparing the surface comprises one or more selected from the group consisting of: UV radiation exposure of the surface, ozone exposure of the surface, plasma exposure of the surface, cleaning of the surface using a cleaning liquid, or cleaning of the surface using an oxidizing liquid. In an embodiment, preparing the surface further comprises exposing the surface to water vapor. In an embodiment, the silane or siloxane is dissolved in a solvent. In an embodiment, the silane or siloxane is brought into contact with the surface in gaseous form. In an embodiment, the silane or siloxane is carried by a carrier gas, desirably nitrogen. In an embodiment, the method further comprises, after bringing the silane or siloxane in contact with the surface, rinsing the surface. In an embodiment, the silane or siloxane is in a gaseous phase at 20° C. In an embodiment, the surface is the surface of a component of a lithographic apparatus. In an embodiment, the method is performed inside the lithographic apparatus. In an embodiment, the coating is 0.1-100 nm thick.

In an embodiment, there is provided a lithographic projection apparatus comprising a coating station configured to form a lyophobic coating on a surface of the lithographic projection apparatus using any method described herein.

In an embodiment, there is provided a coating station to form a lyophobic coating on a surface of a component for a lithographic projection apparatus. In an embodiment, the coating station comprises a reaction vessel to contain a precursor of the coating and bring the precursor into contact with the surface. In an embodiment, the reaction vessel has an inlet to supply precursor into the reaction vessel and an outlet to remove gas from the reaction vessel. In an embodiment, the reaction vessel has an opening through which the surface can be exposed to the precursor in the reaction vessel and a seal to seal an end wall of the reaction vessel defining the opening to the surface to be coated or a surface adjacent to the surface to be coated thereby to contain the precursor in the reaction vessel. In an embodiment, the reaction vessel is openable so that the surface is insertable into and removable from the reaction vessel, desirably under control of the lithographic projection apparatus. In an embodiment, the coating station comprises a compartment to mix a carrier gas with a precursor of the coating and a conduit to provide the mixed carrier gas and precursor to the surface. In an embodiment, the coating station comprises a precursor trap to collect unreacted precursor of the coating. In an embodiment, the coating station comprises a cleaning module. In an embodiment, the coating station comprises a UV source to illuminate the surface.

In an embodiment, there is provided a lithographic projection apparatus comprising any coating station as described herein.

In an embodiment, there is provided a lithographic projection apparatus comprising a coating station configured to form a lyophobic coating on a surface of a component of the lithographic projection apparatus. In an embodiment, the surface is at least part of the surface of a table, desirably a substrate or measurement table. In an embodiment, the surface is the surface of a component mounted on a table, desirably a sensor or a grating. In an embodiment, the surface is a surface of a fluid handling structure. In an embodiment, the coating station is configured to perform any method described herein.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A method of forming a lyophobic coating on a surface of a lithographic apparatus configured to expose a radiation-sensitive substrate, the surface being an existing coating on a component of the apparatus other than the substrate, the surface having oxidized groups representing degradation of the existing coating induced by use of the apparatus, due to exposure to immersion liquid and exposure radiation, the method comprising:

bringing into contact with the surface a silane or siloxane having the formula $SiR1R2X_2$ wherein the R1, R2 and X are the same or different, wherein the R1 is a lyophobic group and the R2 is a leaving group or a group with a leaving group; and reinstating a contact angle of the surface of the component by a chemical reaction between the silane or siloxane and the oxidized groups.

2. The method of claim 1, wherein the surface comprises a polysiloxane structure wherein a proportion of the Si atoms at the surface have the oxidized groups.

3. The method of claim 1, wherein the oxidized groups are a hydroxyl group, or an oxygen atom with a free electron pair, or both.

4. The method of claim 1, wherein all or some of the Xs are either a leaving group or a lyophobic group.

5. The method of claim 1, wherein one or both X is a methyl group or a halogen.

6. The method of claim 1, wherein the lyophobic group R1 is selected from the group consisting of: $(CH_2)_nCH_3$; $(CH_2)_2(CF_2)_nF$; $CF_3$; F; $(Si(CH_3)_2O)_n$ terminated by the leaving group R2.

7. The method of claim 1, further comprising, prior to bringing the silane or siloxane in contact with the surface, preparing the surface.

8. The method of claim 7, wherein preparing the surface comprises one or more selected from the group consisting of:
UV radiation exposure of the surface,
ozone exposure of the surface,
plasma exposure of the surface,
cleaning of the surface using a cleaning liquid, or
cleaning of the surface using an oxidizing liquid.

9. The method of claim 8, wherein preparing the surface further comprises exposing the surface to water vapor.

10. The method of claim 1, wherein the silane or siloxane is dissolved in a solvent.

11. The method of claim 10, wherein the silane or siloxane is carried by a carrier gas.

12. The method of claim 1, further comprising, after bringing the silane or siloxane in contact with the surface, rinsing the surface.

13. The method of claim 1, wherein a leaving group, or a group with a leaving group, of the silane or siloxane has chlorine, bromine, or iodine.

14. The method of claim 13, wherein the leaving group, or the group with the leaving group, of the silane or siloxane has chlorine.

15. A method of forming a coating on a surface of a lithographic apparatus configured to expose a radiation-sensitive substrate, the surface being an existing coating on a component of the apparatus other than the substrate, the method comprising:

exposing the existing coating to immersion liquid and exposure radiation in the apparatus to cause formation of a chemical compound on the surface and degradation of a contact angle of the surface;

bringing into contact with the surface a silane or siloxane having the formula $SiR1R2X_2$ wherein the R1, R2 and X are the same or different, wherein the R1 is a lyophobic group and the R2 is a leaving group or a group with a leaving group; and reinstating the contact angle of the surface of the component by a chemical reaction between the silane or siloxane and the chemical compound.

16. The method of claim 15, wherein a leaving group, or a group with a leaving group, of the silane or siloxane has chlorine, bromine, or iodine.

17. The method of claim 16, wherein the leaving group, or the group with the leaving group, of the silane or siloxane has chlorine.

18. The method of claim 15, wherein the surface comprises a polysiloxane structure wherein a proportion of the Si atoms at the surface have oxidized groups.

19. The method of claim 15, wherein all or some of the Xs are either a leaving group or a lyophobic group.

20. The method of claim 15, wherein the lyophobic group R1 is selected from the group consisting of: $(CH_2)_nCH_3$; $(CH_2)_2(CF_2)_nF$; $CF_3$; F; $(Si(CH_3)_2O)_n$ terminated by the leaving group R2.

* * * * *